US012070840B2

(12) United States Patent
Velázquez Sanchez Toscano et al.

(10) Patent No.: US 12,070,840 B2
(45) Date of Patent: Aug. 27, 2024

(54) CLAMPING OF COMPONENTS, PARTICULARLY WIND TURBINE BLADE TIPS

(71) Applicant: General Electric Renovables España, S.L., Barcelona (ES)

(72) Inventors: Jorge Velázquez Sanchez Toscano, Barcelona (ES); John Carl Bell, Chesapeake, VA (US); Ulrich Neumann, Greenville, SC (US); Lasse Vagtborg Nielsen, Esbjerg (DK)

(73) Assignee: General Electric Renovables Espana, S.L., Barcelona (ES)

( * ) Notice: Subject to any disclaimer, the term of this patent is extended or adjusted under 35 U.S.C. 154(b) by 270 days.

(21) Appl. No.: 17/207,974

(22) Filed: Mar. 22, 2021

(65) Prior Publication Data

US 2021/0299820 A1    Sep. 30, 2021

(30) Foreign Application Priority Data

Mar. 27, 2020   (EP) .................................... 20382243

(51) Int. Cl.
*B25B 5/06*      (2006.01)
*B25B 1/18*      (2006.01)
(Continued)

(52) U.S. Cl.
CPC ............... *B25B 5/06* (2013.01); *B25B 1/18* (2013.01); *B25B 5/003* (2013.01); *B25B 5/006* (2013.01);
(Continued)

(58) Field of Classification Search
CPC .. B25B 5/06; B25B 1/18; B25B 5/003; B25B 5/006; B25B 5/10; B25B 5/14;
(Continued)

(56) References Cited

U.S. PATENT DOCUMENTS 4,409,529 A    10/1983   Basford et al.
8,360,398 B2    1/2013   Diaz De Corcuera et al.
(Continued)

FOREIGN PATENT DOCUMENTS

CN    207699037 U  *  8/2018   ............. B66C 1/108
EP    2873641 A1  *  5/2015   ............. B66C 1/108
(Continued)

OTHER PUBLICATIONS

WO-2012095112-A1 description from Espacenet (Year: 2012).*
(Continued)

*Primary Examiner* — Brian D Keller
*Assistant Examiner* — Tim Brady
(74) *Attorney, Agent, or Firm* — Dority & Manning, P.A.

(57) ABSTRACT

The disclosure relates to methods and tools for handling a component, the tools (10) comprising a first clamp seat (12) for receiving a first surface of the component and a second clamp seat (14, 16) for receiving a second surface of the component, the second surface being opposite to the first surface. The tool further comprises an actuator (45) for moving the first clamp seat to clamp the component between the first clamp seat and the second clamp seat with a predetermined clamping force, and an electric motor (40) for driving the actuator (45). The tool (10) further comprises a control configured to determine currents in the electric motor and to control the electric motor to provide the predetermined clamping force based on the determined currents. Also methods for determining a desired current level in an electric motor driving an actuator for clamping a component and methods for controlling a clamping force in a tool are provided.

9 Claims, 6 Drawing Sheets

(51) Int. Cl.
  *B25B 5/00*   (2006.01)
  *B25B 5/10*   (2006.01)
  *B25B 5/14*   (2006.01)
  *B25H 1/00*   (2006.01)
  *B25H 1/10*   (2006.01)
  *B25H 1/16*   (2006.01)
  *F03D 13/00*  (2016.01)
  *F03D 80/50*  (2016.01)
  *G01R 31/34*  (2020.01)

(52) U.S. Cl.
  CPC .................. *B25B 5/10* (2013.01); *B25B 5/14* (2013.01); *B25H 1/00* (2013.01); *B25H 1/0007* (2013.01); *B25H 1/0021* (2013.01); *B25H 1/0078* (2013.01); *B25H 1/10* (2013.01); *B25H 1/16* (2013.01); *F03D 13/00* (2016.05); *F03D 80/50* (2016.05); *G01R 31/343* (2013.01); *F05B 2230/61* (2013.01); *F05B 2260/30* (2013.01)

(58) Field of Classification Search
  CPC ...... B25H 1/00; B25H 1/0007; B25H 1/0021; B25H 1/0078; B25H 1/16; B25H 1/10; F05B 2230/61; F05B 2260/30
  USPC .......................................................... 269/216

See application file for complete search history.

(56) References Cited

U.S. PATENT DOCUMENTS

| | | | |
|---|---|---|---|
| 8,567,833 B2* | 10/2013 | Maj .................. | B66C 1/108 |
| | | | 294/67.1 |
| 10,161,388 B2* | 12/2018 | Westergaard .......... | B66C 1/108 |
| 2010/0270355 A1* | 10/2010 | Whitman .............. | A61B 17/068 |
| | | | 227/176.1 |
| 2012/0032125 A1* | 2/2012 | Diaz De Corcuera . | B66C 1/108 |
| | | | 254/131 |
| 2014/0184106 A1* | 7/2014 | Kroell .................... | H02P 29/40 |
| | | | 318/6 |
| 2015/0028608 A1* | 1/2015 | Wubbelmann .......... | B66C 1/108 |
| | | | 294/81.61 |
| 2018/0009085 A1* | 1/2018 | Trebes .................... | B25B 1/106 |
| 2018/0257914 A1* | 9/2018 | Franke .................... | B66C 1/44 |
| 2018/0362306 A1* | 12/2018 | Lopez-Benedito ..... | F03D 13/10 |
| 2021/0190042 A1* | 6/2021 | Fenger .................... | B66C 1/108 |

FOREIGN PATENT DOCUMENTS

| | | | | |
|---|---|---|---|---|
| EP | 2873641 A1 | 5/2015 | | |
| WO | WO2012/095112 A1 | 7/2012 | | |
| WO | WO-2012095112 A1 * | 7/2012 | ............ | B66C 1/108 |

OTHER PUBLICATIONS

CN-207699037-U Espacenet translation (Year: 2023).*
EP-2873641-A1 espacenet (Year: 2024).*
WO-2012095112-A1 espacenet (Year: 2024).*
CN-207699037-U espacenet (Year: 2024).*
European Search Report Corresponding to EP20382243.2 dated Sep. 15, 2020.

* cited by examiner

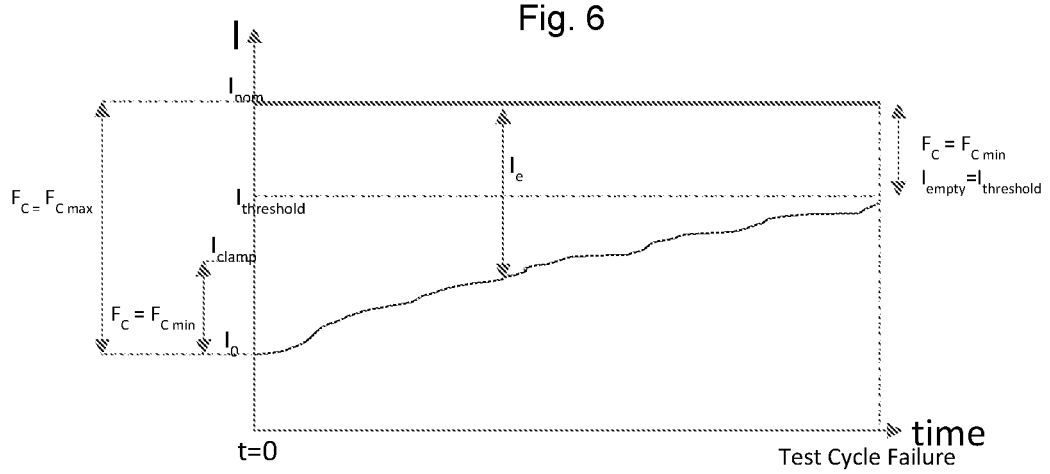

CLAMPING OF COMPONENTS, PARTICULARLY WIND TURBINE BLADE TIPS

The present disclosure relates to tools for handling a component, wherein the component is clamped in the tool. More particularly, the present disclosure related to tools for handling wind turbine blade parts, and particularly wind turbine blade tips. The present disclosure further related to methods for controlling a clamping force in a tool, and to methods for determining a desired current level in an electric motor driving an actuator for clamping a component.

BACKGROUND

Modern wind turbines are commonly used to supply electricity into the electrical grid. Wind turbines of this kind generally comprise a tower and a rotor arranged on the tower. The rotor, which typically comprises a hub and a plurality of blades, is set into rotation under the influence of the wind on the blades. Said rotation generates a torque that is normally transmitted through a rotor shaft to a generator, either directly or through the use of a gearbox. This way, the generator produces electricity which can be supplied to the electrical grid.

For years, there has been a tendency in the field to increase the size of wind turbines. Both the hub height and the length of the blades have increased significantly over the years. Nowadays, blades of more than 70 meters in length, even more than 80 meters and even more than 100 meters are employed on wind turbines.

Blades of such length are difficult to manufacture and to transport. Particularly for the purposes of transport, it is known to manufacture blade parts, a root part and a tip part, separately. The root part and tip part may be transported to a wind park site separately. The root part and tip part may then be joined in situ just before installation. The blade parts may carry specific elements that can mate with each other (e.g. a male—female coupling) to enable easier assembly. For example, one of the tip and root part may carry an elongated pin, which can be inserted in a suitable receptacle in the other part. It is known to provide a part with a portion of the spar protruding beyond its edge. The protruding portion of the spar can then be received and joined in the other part. After assembly of the blades, the blades may be hoisted up towards the hub of a wind turbine that is being erected.

For example, a blade with a length of about 77 meters may be split in a root part of around 65 meters and a tip part with a length of around 12 meters. The weight of such a blade tip part may be around 1.000 kg. The exact dimensions of root and tip parts will of course vary for different blades. In general, the length of a tip part may be between 5 and 20 meters. And such a tip part may have a weight of e.g. 500-2.000 kg approximately.

When the tip part is to be joined to a root part, the root part may be held or at least partially support on a support rack. The tip part is to be lifted in order for it to be brought into proximity of the root part. For the parts to be joined appropriately, the tip part has to be oriented correctly.

Lifting tools with hydraulic clamps are known in the art for such operations. However for lifting, manipulating and orienting a tip part, a hydraulic mechanism may be too complex and expensive.

Examples of the present disclosure provide methods and tools handling parts of wind turbine blades, and other components in general. The problems described herein refer mainly to wind turbine blades, and in particular to the handling of tips of wind turbine blades, but similar challenges exist in different fields.

SUMMARY

In a first aspect of the present disclosure, a tool for handling a component is provided. The tool comprises a first clamp seat for receiving a first surface of the component, a second clamp seat for receiving a second surface of the component, the second surface being opposite to the first surface, and an actuator for moving the first clamp seat with respect to the second clamp seat to clamp the component between the first clamp seat and the second clamp seat with a predetermined clamping force. The tool further comprises an electric motor for driving the actuator, and a control configured to control the electric motor by determining currents in the electric motor and to control the electric motor to provide the predetermined clamping force based on the determined currents.

In accordance with this aspect, a tool for handling a component is provided, which is driven by an electric motor, rather than by a hydraulic mechanism. This makes the tool less complex and less expensive. A challenge when using an electric motor or drive rather than a hydraulic mechanism is that it may be difficult to determine the precise clamping force that is being exerted on the component. For adequate operations, this force needs to be accurately controlled. If the force is too high, the component may be damaged. If the force is too low, there may not be effective clamping and the component could move or fall out.

In accordance with this aspect, the currents in the electric motor are measured to determine the clamping force that is actually being applied. It has been found that the clamping force can be accurately controlled in this manner as opposed to using other controls based on e.g. position of an actuator or speed of the electric motor.

In another aspect, a method for controlling a clamping force in a tool is provided. The method comprises operating an electric motor to drive a first clamp seat with respect to a second clamp seat for clamping a component between the first clamp seat and the second clamp seat, and measuring currents in the electric motor. The method further includes operating the electric motor to reach a desired torque level corresponding to a predetermined clamping force. The desired torque level is determined based on an empty current level, wherein the empty current level is a current level required for operating the electric motor to drive the first clamp seat with respect to a second clamp seat in absence of the component.

In accordance with this aspect, a method for controlling a clamping force is provided which can take into account varying internal losses in the tool. As a tool is used, internal friction in the tool may vary. E.g. parts may wear out, and lubrication may become less effective during the lifetime of a tool. Throughout the lifetime of the tool, the internal friction encountered by the clamp seat may vary. To precisely control the actual clamping force applied to the component, the method foresees that the current level is determined that is required for operating the clamps without any component. In the absence of any component, the currents that will be measured will substantially correspond to the electrical torque required to overcome internal losses in a normal operation i.e. force (currents) necessary to overcome internal losses. In this manner, even if internal losses vary throughout the lifetime of a tool, the desirable clamping force can be applied.

In yet a further aspect, a method for determining a desired current level in an electric motor driving an actuator for clamping a component is provided. The method comprises determining a clamping current necessary for providing a predetermined holding force. The method further comprises operating the electric motor in a test, wherein the test comprises driving the actuator in absence of the component and determining an internal losses current by measuring a current level in the test. Then, the desired current level is determined by adding the clamping current to the internal losses current.

BRIEF DESCRIPTION OF THE DRAWINGS

FIG. 6 illustrates aspects of an example of a test of a clamping tool and an electric motor of the clamping tool.

DETAILED DESCRIPTION OF EXAMPLES

Figure 1:
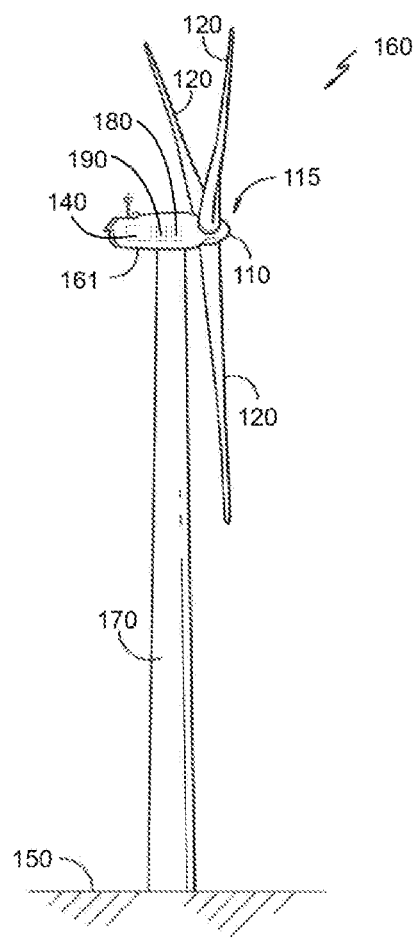
FIG. 1 illustrates a perspective view of one example of a wind turbine.

Reference now will be made in detail to embodiments of the invention, one or more examples of which are illustrated in the drawings. Each example is provided by way of explanation of the invention, not as a limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 illustrates a perspective view of one example of a wind turbine 160. As shown, the wind turbine 160 includes a tower 170 extending from a support surface 150, a nacelle 161 mounted on the tower 170, and a rotor 115 coupled to the nacelle 161. The rotor 115 includes a rotatable hub 110 and at least one rotor blade 120 coupled to and extending outwardly from the hub 110. For example, in the illustrated embodiment, the rotor 115 includes three rotor blades 120. However, in an alternative embodiment, the rotor 115 may include more or less than three rotor blades 120. Each rotor blade 120 may be spaced about the hub 110 to facilitate rotating the rotor 115 to enable kinetic energy to be transferred from the wind into usable mechanical energy, and subsequently, electrical energy. For instance, the hub 110 may be rotatably coupled to an electric generator 162 (FIG. 2) positioned within the nacelle 161 to permit electrical energy to be produced.

Figure 2:
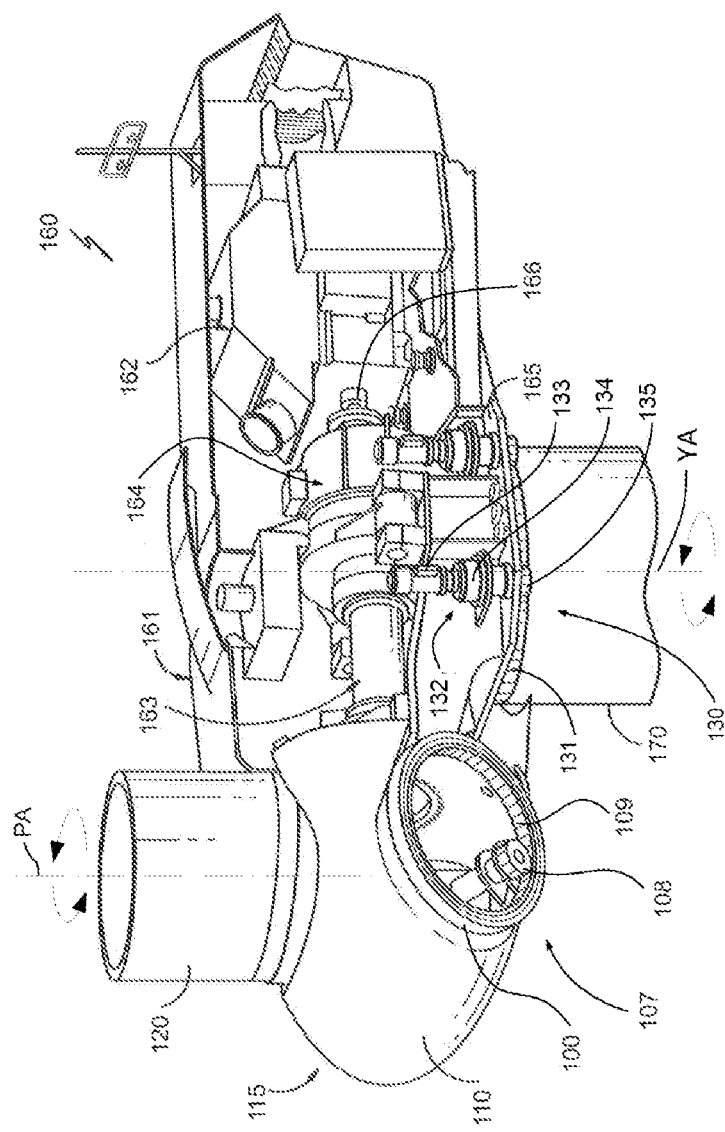
FIG. 2 illustrates a simplified, internal view of one example of the nacelle of the wind turbine of the FIG. 1.

FIG. 2 illustrates a simplified, internal view of one example of the nacelle 161 of the wind turbine 160 of the FIG. 1. As shown, the generator 162 may be disposed within the nacelle 161. In general, the generator 162 may be coupled to the rotor 115 of the wind turbine 160 for generating electrical power from the rotational energy generated by the rotor 115. For example, the rotor 115 may include a main rotor shaft 163 coupled to the hub 110 for rotation therewith. The generator 162 may then be coupled to the rotor shaft 163 such that rotation of the rotor shaft 163 drives the generator 162. For instance, in the illustrated embodiment, the generator 162 includes a generator shaft 166 rotatably coupled to the rotor shaft 163 through a gearbox 164.

It should be appreciated that the rotor shaft 163, gearbox 164, and generator 162 may generally be supported within the nacelle 161 by a support frame or bedplate 165 positioned atop the wind turbine tower 170.

The nacelle 161 is rotatably coupled to the tower 170 through the yaw system 130 in such a way that the nacelle 161 is able to rotate about a yaw axis YA. The yaw system 130 comprises a yaw bearing having two bearing components configured to rotate with respect to the other. The tower 170 is coupled to one of the bearing components and the bedplate or support frame 165 of the nacelle 161 is coupled to the other bearing component. The yaw system 130 comprises an annular gear 131 and a plurality of yaw drives 132 with a motor 133, a gearbox 134 and a pinion 135 for meshing with the annular gear 131 for rotating one of the bearing components with respect to the other.

Blades 120 are coupled to the hub 110 with a pitch bearing 100 in between the blade 120 and the hub 110. The pitch bearing 100 comprises an inner ring and an outer ring. A wind turbine blade may be attached either at the inner bearing ring or at the outer bearing ring, whereas the hub is connected at the other. A blade 120 may perform a relative rotational movement with respect to the hub 110 when a pitch system 107 is actuated. The inner bearing ring may therefore perform a rotational movement with respect to the outer bearing ring. The pitch system 107 of FIG. 2 comprises a pinion 108 that meshes with an annular gear 109 provided on the inner bearing ring to set the wind turbine blade into rotation around a pitch axis PA.

Figure 3:
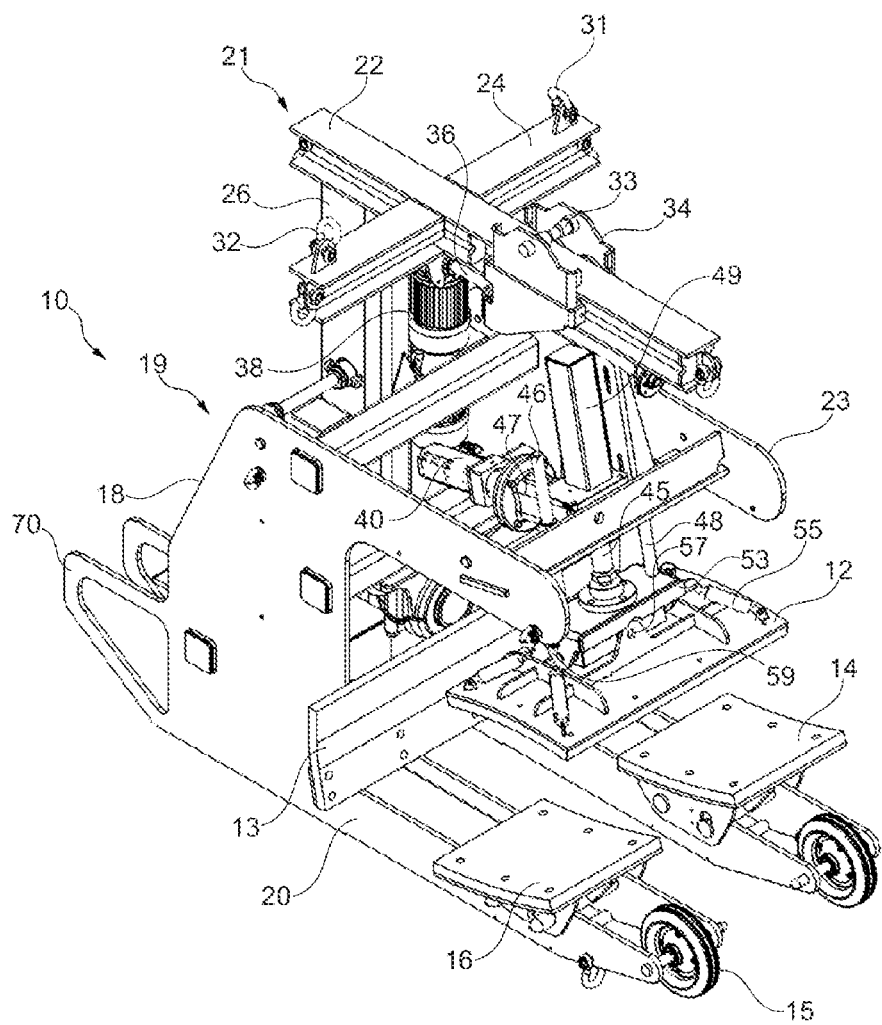
FIG. 3 illustrates an isometric view of an example a tool for clamping a part of a wind turbine blade.
Figure 4:
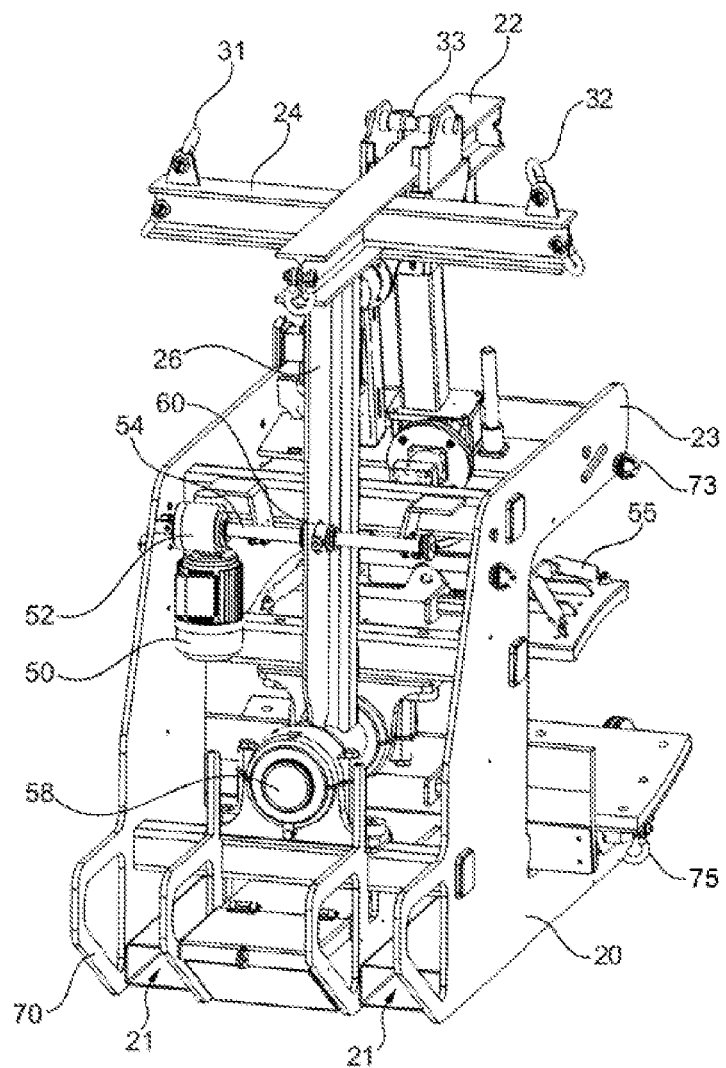
FIG. 4 illustrates rear view of the tool of FIG. 3.
Figure 5:
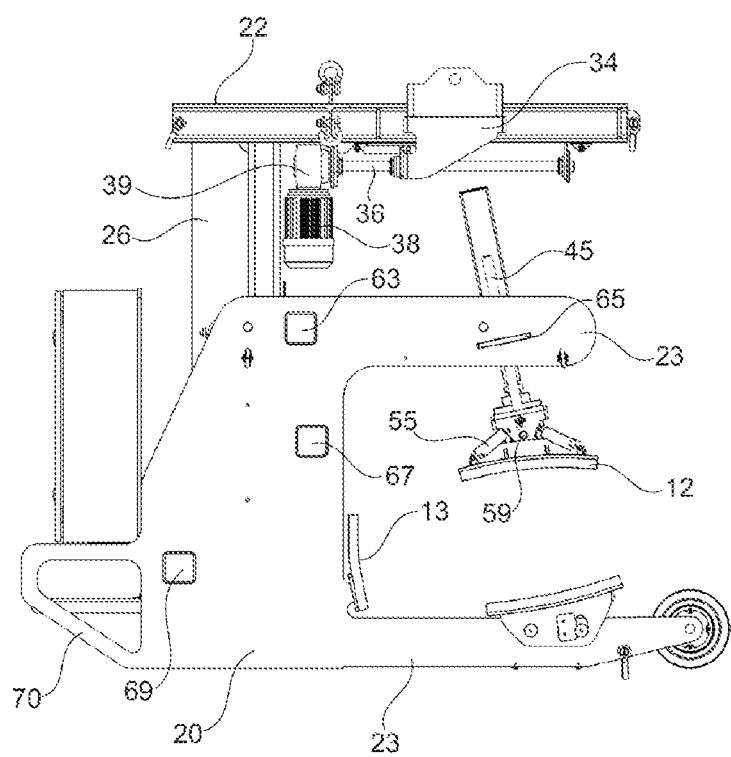
FIG. 5 illustrates a side view of the tool of FIG. 3.

FIG. 3 illustrates an isometric view of an example a tool for clamping a part of a wind turbine blade. FIG. 4 illustrates a rear view of the same tool of FIG. 3. Some parts have been left out from the figure for ease of understanding. And FIG. 5 illustrates a side view of the tool of FIG. 3.

FIG. 3 provides a tool 10 for handling a component, comprising a first clamp seat 12 for receiving a first surface of the component and a second clamp seat 14 for receiving a second surface of the component, the second surface being opposite to the first surface.

The tool 10 further comprises an actuator 45 for moving the first clamp seat 12 with respect to the second clamp seat 14 to clamp the component between the first clamp seat 12 and the second clamp seat 14 with a predetermined clamping force. The tool also includes an electric motor 40 for driving the actuator 45, and a control configured to control the electric motor 40 by determining currents in the electric motor 40 and control the electric motor 40 to provide the predetermined clamping force based on the determined currents.

Measuring the currents or current level in the motor, the effective clamping force may be determined. The level of currents in the motor indicated the level of electrical torque required to drive the electrical motor, and thus the level of electrical torque required to drive the clamp seat. A clamping force may be controlled by suitable controlling the electrical torque in the motor.

In this specific example, the tool 10 may comprise a third clamp seat 16 for receiving the second surface of the part of the wind turbine blade. In non-illustrated examples, a fourth clamp seat might be provided. The fourth clamp seat might be driven by an actuator as well and might be configured to enter into contact with the same surface as the first clamp seat. And in this specific example, the tool 10 may be configured to handle a part of a wind turbine blade, and particularly a wind turbine blade tip.

In this specific example, a suction surface of a wind turbine blade part may be engaged by first clamp seat 12. The pressure surface of the wind turbine blade part may be engaged by second and third clamp seats 14, 16. By clamping the wind turbine blade part between the clamp seats, the part may be manipulated. In other examples using blade parts, the first clamp seat may instead engage the pressure surface, and the second clamp seat (and optionally a third clamp seat) may engage the suction surface.

In an operation to mount the tip part of a blade to a root part, the tool 10 may be lifted by a crane. The tip part may be clamped by the tool and the tool (and therewith the tip part) may be brought into proximity with the root part. During the assembly process, the tip part may thus be securely supported in the tool. The clamping force should not be too high because the wind turbine blade tip might be damaged. At the same time, the clamping force should be high enough to make sure the blade tip is effectively clamped and cannot fall out of the tool.

In some examples, the control may be configured to determine electrical currents in the electric motor 40 caused by internal friction in the tool 10. By determining the internal friction in the tool 10, the clamping force may be more accurately be controlled.

In some examples, the electrical currents in the electric motor caused by internal friction in the tool may be determined by operating the electric motor in absence of the component (in this example, the wind turbine blade tip). In the absence of the component, the currents in the motor will substantially correspond to the currents necessary to overcome resistance and friction in the tool. In normal operation, a part of the resistance experienced by the clamp seats (and thus a part of the currents measured in the motor) is not due to the actual clamping of the component, but rather due to internal losses in the tool. In order to very precisely control the clamping force that is applied to the wind turbine blade, the currents caused by internal losses may therefore be deducted from the measured currents to give an indication of the applied clamping force.

In the specifically disclosed example, the actuator for moving the first clamp seat 12 is a threaded spindle 45 arranged in a nut. By rotating the threaded spindle 45, it can protrude from housing 49, or be retracted into it. The position of the clamp seat 12 can thus be determined by driving the threaded spindle. By driving the spindle 45 the relative position of the first clamp seat 12 with respect to the second and third clamp seats 14, 16 can be controlled.

A spindle may herein be regarded as a rod or pin serving as an axis which revolves when actuated upon. A nut may herein be regarded as a component having a threaded hole.

In the specific example of FIG. 1, the upper clamp seat 12 is driven, whereas the lower clamp seats 14 and 16 remain fixed in place. It should be clear however that in other examples, this could be the other way around. It should also be clear that in other examples, other mechanisms for controlling the position of one clamp seat with respect to another may be varied.

In some examples, the tool 10 may comprise a frame 18 including one or more lifting attachments 31, 32 and 33 for lifting the tool. The lifting attachments 31, 32, 33 may be configured for being lifted with a crane. The lifting attachments may comprise shackles, hooks, eyelets or any other fastener for attachment to hooks mounted on crane lines. In this specific example of FIG. 1, the lifting attachments 31, 32 are eyelets and the lifting attachment 33 is a shaft.

In some examples, at least one of the lifting attachments is movable with respect to the frame. In this specific example, lifting attachment 33 may be a shaft on a movable slide 34. The movable slide 34 may be guided along longitudinal beam 22 of a top part 21 of frame 18.

The tool 10 may further comprise a lifting attachment actuator 36 for controlling a position of the movable lifting attachment 33. In this example, slide 34 can be driven forwards and backwards by actuating motor 38. Motor 38 through a suitable transmission may drive threaded spindle 36. The threaded spindle 36 may be rotatably mounted in a nut in the slide 34. By rotating the spindle 36, the position of the slide 34 with respect to beam 22 may be varied.

Being able to vary and control the position of one or more of the lifting attachments may have the effect of adapting the lifting attachment position with respect to a centre of gravity. When the tool is lifted without a wind turbine blade tip inside, the centre of gravity will be in a different position than when the wind turbine blade tip is carried inside. The centre of gravity will vary both in the longitudinal direction (in this case defined as parallel to the longitudinal beam 22) and in the transverse direction (in this case defined as parallel to transverse beam 24 and coinciding substantially with a length of a wind turbine blade tip when mounted in the tool). The longitudinal position of the lifting attachment 33 may be varied to adopt to different situations and make sure the tool may be held in a desirable, e.g. substantially horizontal position. The relative displacement of attachment 33 that may be necessary will vary for different blades with different sizes.

An operation of adjusting the position of the lifting attachment with respect to the frame may in some examples be carried out when the component has been barely lifted, i.e. just above ground level. The tool with component may be carefully lifted, and as lifting occurs, the tool will have a tendency to rotate around a transverse axis. By adjusting the position of the lifting attachment 33 such a rotation can be controlled and counteracted. In other examples, adjusting the position(s) of the lifting attachment(s) may be carried out after lifting to e.g. an operating height or when the tool is still positioned on the ground.

In operation some rotation forwards or backwards around the transverse axis ("tilting") may be desirable or required for easier assembly of the blade tip to the blade root. Sling fixtures 70 may be provide at a rear of frame 20. Slings may be passed through the openings and by pulling slings upwards or releasing them downwards, precise control of the tilting may be provided. Slings or cables may alternatively or additionally be attached at shackles 73, 75 arranged at an opposite side of the tool, i.e. at or near the front.

Additionally or alternatively, pitching of the component (i.e. a rotation around its longitudinal axis) may be accomplished by providing a chain hoist suspended from a crane, and wherein cables of the chain hoist may be attached at two different points at the top of the frame. Optionally, in the case of a blade part, a first point may be located in use towards or in front of the leading edge of the blade part and a second point may be located towards or behind the trailing edge. By operating the chain hoist, the pitch angle of the blade may be varied.

Yet a further alternative or additional option for providing pitching is provided by actively moving one or more lifting attachments as the component is held in the tool. In this particular example, lifting attachment 33 may be moved linearly by actuator 36 as has been explained before. By moving the lifting attachment, the tool (and component) therein will rotate to a new equilibrium, The frame 18 may comprise a base 20 carrying one of the first and second clamp seats, and a top frame 21 carrying the lifting attachments. The tool may further comprise a middle frame 19 carrying the other of the first and second clamp seats. The middle frame may comprise parallel arms 23. A plurality of transverse beams 63, 65, 67 and 69 (which may be seen particularly in FIGS. 4 and 5) may extend from one side of the tool to another and provide sufficient strength and stiffness. Transverse beam 65 extending between arms 23 may carry one of the clamp seats with corresponding actuator and driving system.

The top frame 21 may include a support beam 26 that is rotatably mounted with respect to the base 20, and one or more arms 22, 24 mounted on the support beam 26 and carrying the lifting attachments. The tool may further comprise a top frame actuator 54 for controlling an orientation of the support beam 26 with respect to the base 20 of the frame.

Support beam 26 may be substantially vertical and may be mounted in a swivel 58 (which may be seen in particular in FIG. 4) such that it can rotate about a substantially horizontal axis with respect to base 20. A motor 50 may through a suitable transmission (gearing) 52 drive spindle 54. Spindle 54 is threadedly mounted in nut 60 which is attached to vertical support beam 26. By driving the motor, the distance of nut 60 with respect to transmission 52 may be varied. By varying this distance, the orientation of the support beam 26 with respect to the vertical may be varied. The relative orientation between the base 20 and top 21 may thus be varied, and the described arrangement can thus make sure that the blade tips may be held in a suitable orientation as needed. Also, if differently sized blades and blade tips are used, the control of the vertical support beam 26 allows rotation as needed.

Also in this aspect of the control of the orientation of the tool, alternatively or additionally, a chain hoist suspended from a crane may be used. By actively controlling lines from the chain hoist to various attachment points, orientation control of the tool may be increased.

In some examples, one or more of the clamp seats 12, 14 and 16 may be releasably mounted on the tool. Various kits of clamp seats can be provided to adapt for different blades. E.g. the length, width and internal curvature may be varied in different kits to adapt for different curvatures in the pressure and/or suction surface of the wind turbine blade parts.

In some examples, the clamp seats 12, 14, 16 may have a padding to avoid damage to the surfaces of the component that is being handled and to provide sufficient friction for effectively holding a component. The padding may be made of e.g. polyurethane.

In the specific example of FIG. 3, the upper or first clamp seat 12 is rotatable about two perpendicular axes 57 and 59 with respect to base plate 53 which is driven by spindle 45. The clamp seat 12 can thus adapt to small variations in the components to be lifted or to small variations in the portions of the components where clamping takes place. Springs 55 or alternative resilient elements may be provided for providing tension to clamp seat 12 such that any rotation or movement of the clamp seat 12 is suitably absorbed.

The base plate 53 of the first clamp seat 12 in this specific example may be guided in linear guides, e.g. two vertical linear guides 46 and 48 such that displacement of clamp seat 12 is more precise and shear loads can be absorbed. Such guides can also prevent free rotation of base plate 53 and the whole clamp seat.

It may be seen that base 20 further may comprise a bumper 13 with suitable impact absorption (e.g. protective padding) to avoid damaging the component once arranged inside the tool. The bumper 13 may also serve as a reference for correctly positioning a component within the tool.

From the rear view of FIG. 4, it may be seen that base 20 may further comprises sleeves 21 for receiving a fork of a forklift. The tool 20 may thus be easily transported and moved as necessary. Rollers 15 may be provided at a front of the tool to avoid damage to the components to be lifted and to other nearby objects. For example, wind turbine blade tips may be stacked in a frame on top of each other and may be lifted from the frame one after another. In a manoeuvre of approaching the blade tips, the rollers or wheels 15 may serve as a bumper for impact absorption and avoiding damage to the blade tips.

In an aspect, a method for controlling a clamping force in a tool is provided. This method may be illustrated with reference to e.g. FIG. 6.

In order to control a clamping force in a tool, an electric motor 40 may be operated to drive a first clamp seat 12 with respect to a second clamp seat 14, 16 for clamping a component between the first clamp seat 12 and the second clamp seat 14, 16. During operation currents in the electric motor 40 may be measured, and the electric motor 40 may be operated to reach a desired current level corresponding to a predetermined clamping force. The desired current level is determined based on an empty current level, wherein the empty current level is a current level required for operating the electric motor to drive the first clamp seat with respect to a second clamp seat in absence of the component.

An empty current level may be determined in a test prior to operating the electric motor for clamping the component. Optionally, the test may be performed prior to every operation for clamping the component.

In a calibration of the tool, which may be carried out periodically, e.g. once a year, a nominal current (i.e. a maximum current in normal operation of the electric motor) may be determined as well as a current level in the motor that corresponds to the desired clamping force.

Before every operation of the tool, a test may be carried out of the tool, wherein the first clamp seat is driven towards the second clamp seat without a component being mounted in between. The currents measured in the motor in the text will correspond to the driving energy and torque necessary for simply displacing the clamp seat. The level of torque or current required in this test may vary due to varying internal losses and friction in the tool. Such internal friction and losses may occur in the electric motor, in the transmission between electric motor and actuator, and also e.g. in the actuator. In the illustrated example, the actuator is the spindle. Both in the spindle driven by the motor and between the spindle and but, losses occur. These losses will vary particularly as a result of wear and tear of components.

A test to determine the empty current level (the level of current when the tool is empty) can reliably determine the internal losses at each moment in time. If the internal friction and losses are too high, it may be that the electric motor cannot provide sufficient clamping force. E.g. if the nominal current minus the empty current level is lower than the current level necessary for the clamping force, the operation of the tool might be inhibited.

A threshold ($I_{threshold}$) for inhibiting operation may be provided by the following equation: $I_{threshold} = I_{nom} - I_{clamp}$, wherein $I_{nom}$ is a nominal current of the electric motor, and $I_{clamp}$ is a level of currents necessary to provide the predetermined clamping force.

If the operation of the tool is not inhibited (i.e. sufficient clamping force can be provided), the empty current level can be taken into account to determine for each operation, the desired current level corresponding to the predetermined clamping force.

With reference to FIG. 6, $I_0$ may correspond to the empty current level at the beginning of the lifetime of the tool. As the tool is used, and components wear out, the empty current level may increase. At any point in time the margin between the nominal current $I_{nom}$ and $I_{empty}$ is the margin of the motor to provide sufficient clamping force. This margin may be the highest at t=0, and at that point in time therefore the maximum clamping force can be provided. When $I_{empty}$ reaches the level of $I_{threshold}$, the motor cannot provide $I_{clamp}$ anymore, and operation may be inhibited. When this is the case, the tool may be at the end of its lifetime or may need some repair or maintenance to reduce the internal losses.

A method for determining a desired current level in an electric motor driving an actuator for clamping a component has herein been illustrated. The method may comprise determining a clamping current necessary for providing a predetermined holding force. Such a clamping current may be determined e.g. in a calibration of the tool.

The method may further comprise operating the electric motor in a test, wherein the test comprises driving the actuator in absence of the component: and determining an internal losses current by measuring a current level in the test. Then, the desired current level (in normal operation) may be determined by adding the clamping current to the internal losses current.

The present disclosure also relates to methods for handling a component, and in particular, a wind turbine blade part using a tool according to any of the examples disclosed herein. Handling may herein include holding, and/or moving and/or orienting and/or lifting.

The present disclosure further also relates to methods for assembling a wind turbine blade, comprising positioning a blade root part, optionally on a rack. Then the methods may comprise lifting and holding a wind turbine blade tip using a tool according to any of the examples disclosed herein. The methods may further comprise bringing the blade tip part in proximity of the blade root part while the blade tip part is held in such a tool. The methods may then comprise joining the blade tip part to the blade root part. In some examples, the blade tip part and blade root part may comprise male and female connectors for joining the parts. In some examples, the methods may include rotating the blade tip part with respect to the blade root part before joining. A rotation may be around the longitudinal axis of the blade (i.e. "pitching") or a transverse axis or a substantially vertical axis. Rotations may be carried out in accordance with any of the examples disclosed herein and may be carried out, before, during or after approaching the blade root part. Lifting may include lifting by a crane.

The present disclosure also relates to kits for handling wind turbine blade parts. The kits may comprise a tool according to any of the examples disclosed herein and one or more sets of clamping seats for removably mounting on the tool. The sets of clamping seats may include at least a first clamping seat for clamping on a first blade surface and a second clamping seat for clamping on a second, opposite, blade surface. A set of clamping seat may also include a third clamping seat as herein previously disclosed. The first and second clamping seats may be configured for clamping a tip part of a specific wind turbine blade. The kits may further comprise a set of clamping seats configured to clamp a tip part of a different wind turbine blade. The clamping seats mounted on a tool may be substituted by others whenever a different blade (tip) is to be handled.

For completeness, various aspects of the present disclosure will be set out in the following numbered clauses:

Clause 1. A tool for handling a component, comprising:
    a first clamp seat for receiving a first surface of the component
    a second clamp seat for receiving a second surface of the component, the second surface being opposite to the first surface,
    an actuator for moving the first clamp seat with respect to the second clamp seat to clamp the component between the first clamp seat and the second clamp seat with a predetermined clamping force,
    an electric motor for driving the actuator, and
    a control configured to determine currents in the electric motor and to control the electric motor to provide the predetermined clamping force based on the determined currents.

Clause 2. The tool according to clause 1, wherein the control is further configured to determine electrical currents in the electric motor caused by internal friction in the tool.

Clause 3. The tool according to clause 2, wherein the control is configured to determine the electrical currents in the electric motor caused by internal friction in the tool by operating the electric motor in absence of the component.

Clause 4. The tool according to any of clauses 1-3, wherein the actuator for moving the first clamp seat is a threaded spindle arranged in a nut.

Clause 5. The tool according to any of clauses 1-4, comprising a third clamp seat for receiving the second surface of the part of the wind turbine blade.

Clause 6. The tool according to any of clauses 1-5, further comprising a frame, and the frame including one or more lifting attachments for lifting the tool.

Clause 7. The tool according to clause 6, wherein at least one of the lifting attachments is movable with respect to the frame.

Clause 8. The tool according to clause 7, further comprising a lifting attachment actuator for controlling a position of the movable lifting attachment.

Clause 9. The tool according to any of clauses 6-8, wherein the frame comprises
    a base carrying one of the first and second clamp seats,
    a top frame carrying the lifting attachments.

Clause 10. The tool according to clause 9, further comprising a middle frame carrying the other of the first and second clamp seats.

Clause 11. The tool according to clause 10, wherein the top frame includes a support beam that is rotatably mounted with respect to the base, and one or more arms mounted on the support beam and carrying the lifting attachments.

Clause 12. The tool according to clause 11, and further comprising a top frame actuator for controlling an orientation of the support beam with respect to the base of the frame.

Clause 13. The tool according to any of clauses 1-12, wherein the tool is configured for handling a part of a wind turbine blade, and optionally is configured to handling a wind turbine blade tip.

Clause 14. A method for controlling a clamping force in a tool, operating an electric motor to drive a first clamp seat with respect to a second clamp seat for clamping a component between the first clamp seat and the second clamp seat, measuring currents in the electric motor, and operating the electric motor to reach a desired electrical torque level corresponding to a predetermined clamping force, wherein the desired electrical torque level is determined based on an empty current level, wherein the empty current level is a current level required for operating the electric motor to drive the first clamp seat with respect to a second clamp seat in absence of the component.

Clause 15. The method according to clause 14, wherein the empty current level is determined in a test prior to operating the electric motor for clamping the component.

Clause 16. The method according to clause 15, wherein the test is performed prior to every operation for clamping the component.

Clause 17. The method according to any of clauses 14-16, wherein operation of the electric motor is inhibited if the empty current level is above a predetermined threshold.

Clause 18. The method according to clause 17, wherein the predetermined threshold $I_{threshold}$ is determined by the following equation: $I_{threshold} = I_{nom} - I_{clamp}$, wherein $I_{nom}$ is a nominal current of the electric motor, and $I_{clamp}$ is a level of currents necessary to provide the predetermined clamping force.

Clause 19. A method for determining a desired current level in an electric motor driving an actuator for clamping a component, comprising:
determining a clamping current necessary for providing a predetermined holding force;
operating the electric motor in a test, wherein the test comprises driving the actuator in absence of the component;
determining an internal losses current by measuring a current level in the test;
determining the desired current level by adding the clamping current to the internal losses current.

Clause 20. The method according to clause 19, wherein the clamping current is determined a calibration phase.

Clause 21. A method for handling a component, and in particular, a wind turbine blade part, comprising:
using a tool according to any of clauses 1-13 to clamp the component.

Clause 22. The method according to clause 21, further comprising: lifting and moving the component.

Clause 23. The method according to clause 21 or 22, and further comprising rotating the component about one or more axes of rotation.

Clause 24. The method according to clause 23, wherein the component is a wind turbine blade tip part, and wherein rotating about one or more axes of rotation includes rotating the wind turbine blade tip part about a longitudinal axis of the wind turbine blade tip part, and/or rotating the wind turbine blade tip part about an axis perpendicular to the longitudinal axis.

Clause 25. A method for assembling a wind turbine blade, comprising:
positioning a blade root part, optionally on a rack;
lifting and holding a wind turbine blade tip part using a tool according to any of clauses 1-13;
bringing the wind turbine blade tip part in proximity of the blade root part; and
joining the blade tip part to the blade root part.

Clause 26. The method of clause 25, wherein the blade tip part and blade root part comprise male and female connectors for joining the parts.

Clause 27. The method of clause 25 or 26, comprising rotating the blade tip part with respect to the blade root part before joining.

Clause 28. The method of any of clauses 25-27, wherein the lifting comprises lifting with a crane.

Clause 29. A kit for handling wind turbine blade parts, particularly wind turbine blade tip parts, the kit comprising:
the tool according to any of clauses 1-13; and
one or more sets of removable clamping seats.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application. If reference signs related to drawings are placed in parentheses in a claim, they are solely for attempting to increase the intelligibility of the claim, and shall not be construed as limiting the scope of the claim.

The invention claimed is:

1. A tool for handling a component, comprising:
a first clamp seat configured to receive a first surface of the component;
a second clamp seat configured to receive a second surface of the component, the second surface being opposite to the first surface;
the first clamp seat moveable in a linear path towards and away from the second clamp seat to receive the component between the first and second clamp seats;
an actuator configured to move the first clamp seat towards the second clamp seat along the linear path after receipt of the component between the first and second clamp seats to variable clamping positions with respect to the second clamp seat to clamp the component between the first clamp seat and the second clamp seat with a predetermined clamping force in a direction along the linear path at the variable clamping positions;
an electric motor that drives the actuator;
a control configured to determine currents in the electric motor and to control the electric motor to provide the predetermined clamping force based on the determined currents;
wherein the clamping force in the direction along the linear path is determined and varied for different types of components by controlling the electric motor based on the determined currents to change position of the first clamp seat along the linear path;
a frame having one or more lifting attachments configured to lift the tool, wherein the frame comprises a base carrying one of the first or second clamp seats, and a top frame carrying the lifting attachments; and wherein the top frame comprises a support beam rotatably mounted with respect to the base, and one or more arms mounted on the support beam that carry the lifting attachments.

2. The tool according to claim 1, further comprising a top frame actuator that controls an orientation of the support beam with respect to the base.

3. The tool according to claim 1, wherein the tool is configured for handling a component of a wind turbine blade.

4. The tool according to claim 1, wherein the actuator comprises a threaded spindle engaged in a nut, the threaded spindle driving the first clamp seat along the linear path.

5. The tool according to claim 1, further comprising a third clamp seat configured to receive the second surface of the component.

6. The tool according to claim 1, wherein at least one of the lifting attachments is movable with respect to the frame, and further comprising a lifting attachment actuator that controls a position of the movable lifting attachment.

7. The tool according to claim 1, wherein the frame comprises a base carrying one of the first or second clamp seats, and a top frame carrying the lifting attachments.

8. The tool according to claim 1, wherein the control is further configured to determine electrical currents in the electric motor caused by internal friction in the tool.

9. The tool according to claim 8, wherein the control is configured to determine the electrical currents in the electric motor caused by internal friction in the tool by operating the electric motor in absence of the component.

\* \* \* \* \*